US006353639B1

(12) United States Patent
Prange et al.

(10) Patent No.: US 6,353,639 B1
(45) Date of Patent: Mar. 5, 2002

(54) FILTER CONFIGURATION AND SLOPE DETECTOR FOR QUADRATURE AMPLITUDE MODULATED SIGNALS

(75) Inventors: Stefan Prange, München; Heribert Geib, Grafing; Erik De Man, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/531,193

(22) Filed: Mar. 20, 2000

Related U.S. Application Data (63) Continuation of application No. PCT/DE98/02663, filed on Sep. 9, 1998.

(30) Foreign Application Priority Data

Sep. 18, 1997 (DE) .......................... 197 41 181

(51) Int. Cl.[7] .......................... H04L 5/12; H04L 23/02; H04L 27/06; H03D 3/02
(52) U.S. Cl. .......................... 375/261; 375/340; 329/323
(58) Field of Search .................... 375/261, 340; 329/323

(56) References Cited

U.S. PATENT DOCUMENTS

| | | | | |
|---|---|---|---|---|
| 4,647,864 A | * | 3/1987 | Rafferty et al. ............. | 329/302 |
| 4,755,761 A | * | 7/1988 | Ray, Jr. ....................... | 329/323 |
| 4,804,924 A | * | 2/1989 | Chassaing et al. ........... | 329/316 |
| 5,781,589 A | * | 7/1998 | Yom ............................ | 375/340 |

OTHER PUBLICATIONS

De Man et al; Architecture and Circuit Design of a 6–GOPS Signal Processor for QAM Demodulator Application 1995, I.E.E.E., pp. 219–227.*

De Man et al; 60–MBaud single–chip QAM Processor for the complete Base–band Signal Processing of QAM Demodulators; I.E.E.E., pp. 275–278.*

B. Lankl, G. Sebald; Fully Digital Slope for Advanced Digital Radio Systems, 1992 I.E.E.E., pp. 1528–1533.*

"A Double Nyquist Digital Product Detector for Quadrature Sampling" (Pellon), dated Jul. 1992, 8084 IEEE Transactions on Signal Processing, No. 7, New York, US, pp. 1670–1680.

"Architecture and Circuit Design of a 6–GOPS Signal Procesor For QAM Demodulator Applications" (De Man et al.), dated Mar. 1995, 8107 IEEE Journal of Solid–State Circuits, No. 3 New York, US, pp. 219–226, as mentioned on p. 2 of the specification.

"A Multilevel QAM Demodulator VLSI with Wideband Carrier Recovery and Dual Equalizing Mode" (Yamanaka et al.), dated Jul. 1997, XP–000729369, vol. 32, No. 7, pp. 1101–1107.

* cited by examiner

*Primary Examiner*—Stephen Chin
*Assistant Examiner*—Tony Al-Beshrawi
(74) *Attorney, Agent, or Firm*—Herbert L. Lerner; Laurence A. Greenberg; Werner H. Stemer (57) ABSTRACT

A filter configuration for a demodulated QAM signal has a first channel for a cosine demodulated component of the QAM signal, a second channel for a sine demodulated component of the QAM signal, a filter circuit, which receives the two signal components and for each signal component has one transfer function that is composed of terms in phase with this signal component and terms phase-shifted from it by $\pi/2$ and/or $-\pi/2$. The circuit configuration also includes a cross branch for picking up signal portions from the respectively other channel that correspond to the phase-shifted terms of the transfer function. In a first state, the circuit configuration connects the input of the cross branch to the first channel and the output of the cross branch to the second channel, and in a second state connects the input of the cross branch to the second channel and the output of the cross branch to the first channel. A slope detector especially suitable for use with this filter configuration is also provided. The circuit configuration requires a reduced amount of circuitry and can be integrated on a small surface area of a semiconductor substrate.

16 Claims, 5 Drawing Sheets

FILTER CONFIGURATION AND SLOPE DETECTOR FOR QUADRATURE AMPLITUDE MODULATED SIGNALS

CROSS-REFERENCE TO RELATED APPLICATION

This is a continuation of copending International Application PCT/DE98/02663, filed Sep. 9, 1998, which designated the United States.

BACKGROUND OF THE INVENTION

FIELD OF THE INVENTION

The present invention relates to a filter configuration for quadrature amplitude modulated (QAM) signals. The filter configuration can be used in particular but not exclusively in a frequency range equalizer for such signals. The invention also relates to a slope detector for detecting a slope of the power spectrum of the QAM signal.

Quadrature amplitude modulation is employed particularly in the color television industry for modulation of two mutually independent signals, such as a luminance signal and a color difference signal, to a common carrier oscillation by modulation of its amplitude and phase. For a demodulation of the QAM signal back to the base band range, the QAM signal is multiplied by a (cosine) oscillation in phase with the original carrier and, respectively, by a (sine) oscillation phase-shifted by 90° and is low-pass filtered, as a result of which two signal components are obtained. These signal components will be distinguished hereinafter by the designations I and Q.

Filter configurations for QAM signals modulated in this way generally include two largely identically configured channels for the two components of the signal. For instance from the article "Architecture and Circuit Design of a 6 GOPS Signal Processor for QAM Demodulator Applications" by De Man et al., IEEE JSSC, Vol. 30, No. 3, March 1995, a filter configuration is known that has a first channel for a cosine demodulated component of the QAM signal and a second channel for a sine demodulated component of the QAM signal. The filter configuration also has a filter circuit, which receives the two signal components and for each signal component has one transfer function that is composed of terms that are in phase with this signal component and terms that are phase-shifted by $\pi/2$ and/or $-\pi/2$ with respect to it. The filter configuration further includes a cross branch for picking up signal components from the respectively other channel, wherein the signal components correspond to the phase-shifted terms of the transfer function. The cross branch is provided twice and each respective cross branch is fixedly assigned to one of the two channels.

Another filter configuration for demodulated QAM signals, also known from the above-cited article by de Man et al., is a slope detector which receives the two components of a QAM signal. The slope detector has a differential stage, which forms the difference between a received data value and the most recently received previous data value of the same component. The slope detector further has a multiplication stage, which forms the product of a difference value, derived from the first component, with a difference value derived from the second component. Separate channels for the two components are provided, and each channel includes one difference stage and one multiplication stage.

This doubling of circuit elements is complicated and expensive, and for an integrated embodiment of the filter configuration it requires a considerable substrate surface area.

SUMMARY OF THE INVENTION

It is accordingly an object of the invention to provide a filter configuration, such as a frequency range equalizer or a slope detector, for demodulated QAM signals which overcomes the above-mentioned disadvantages of the heretofore-known configurations of this general type and which substantially avoids the above-mentioned double expense.

With the foregoing and other objects in view there is provided, in accordance with the invention, a filter configuration for a demodulated QAM signal, including:

a first channel for a cosine demodulated QAM signal component;

a second channel for a sine demodulated QAM signal component;

a filter circuit for receiving the signal components, the filter circuit having transfer functions for the signal components, the transfer functions including terms in phase with the signal component of a respective one of the first an second channels and including terms phase-shifted by at least one of $\pi/2$ and $-\pi/2$ with respect to the signal component of the respective one of the first an second channels;

the filter circuit including a cross branch having an output and an input for picking up signal portions from a respective other one of the first and second channels, the signal portions corresponding to the terms of the transfer functions phase-shifted by at least one of $\pi/2$ and $-\pi/2$; and a switch configuration having a first state and a second state, the switch configuration, when being in the first state, connecting the input of the cross branch to the first channel and the output of the cross branch to the second channel, the switch configuration, when being in the second state, connecting the input of the cross branch to the second channel and the output of the cross branch to the first channel.

In the filter configuration described initially above, a first way of attaining the object of the invention is to provide a circuit configuration which in a first state connects the input of the cross branch to the first channel and the output of the cross branch to the second channel, and in a second state connects the input of the cross branch to the second channel and the output of the cross branch to the first channel. This provision makes it possible to assign the cross branch to the first and, respectively, to the second channel in alternation, so that only one cross branch is now required.

Preferably, the circuit configuration includes in each channel a switch, which passes arriving data to the channel or to the cross branch in alternation. As a result, data values of one component, which are needed only for generating phase-shifted terms in the respectively other channel, are suppressed in the channel at which they arrive. Thus the affected channel is relieved of processing tasks whose results are not needed later anyway.

The cross branch preferably includes a multiplier for multiplication by a weighting factor a. Particularly if the filter configuration of the invention is meant for use as a frequency range equalizer, transfer functions of the form $$S_I(z) = ia + z^{-T/2} - iaz^{-T}$$

and $$S_Q(z) = -ia + z^{-T/2} + iaz^{-T}$$

for the channels I and Q, respectively, can be implemented in it. T designates the clock period of the data of the demodulated signal components. Here, one multiplier suffices. The value of the factor a is expediently adjustable as a function of the distortion of the signal spectrum, and this distortion is measured by a slope detector. The cross branch also preferably includes a register for delaying a data value by the time T.

Each channel can be assigned one adder, and the circuit configuration delivers the output signal of the cross branch in alternation to one of the two adders for addition to the signal transmitted over the applicable channel.

A further simplification is obtained if instead of the two adders, each assigned to one channel, only one adder is provided, having a first input that is connected in alternation by a switch to the first and second channel, respectively, and having a second input that is connected to the output of the cross branch.

In accordance with another feature of the invention, the cross branch includes at least one delay register.

In accordance with yet another feature of the invention, the phase-shifted terms of one of the transfer functions are of equal magnitude and opposite to the phase-shifted terms of another one of the transfer functions.

In accordance with a further feature of the invention, a first adder assigned to the first channel and a second adder assigned to the second channel are provided. The first adder connects the output of the cross branch to the first channel, the second adder connects the output of the cross branch to the second channel.

In accordance with another feature of the invention, the first and second adders add signal portions transmitted via the cross branch with respectively different signs to respective ones of the signal components transmitted respectively via the first and second channels.

In accordance with yet a further feature of the invention, the filter configuration includes a switch and an adder having a first input alternately connected, via the switch, to the first and second channels, and having a second input connected to the output of the cross branch.

With the object of the invention in view there also provided, a slope detector, which is especially suitable for use in conjunction with the filter configuration of the invention. The slope detector includes:

a difference stage alternately receiving data values of a first component of a QAM signal and data values of a second component of the QAM signal for forming a respective difference between a data value and a most recently received previous data value of a respective one of the first and second components of the QAM signal;

a multiplication stage for forming a product of a difference value, derived from one of the first and second components of the QAM signal, and a further difference value derived from another one of the first and second components of the QAM signal; and the multiplication stage including a first register for storing one of the difference value and the further difference value derived alternately from the first and second components of the QAM signal.

In accordance with another feature of the invention, the first register of the slope detector is configured to output one of the difference value and the further difference value with a delay of half of a clock period.

In accordance with yet another feature of the invention, the multiplication stage includes a second register which is configured to output one of the difference value and the further difference value with a delay of one and a half clock periods. The multiplication stage further includes a switch and a multiplier, the switch connects the output of the first register and the output of the second register to the multiplier.

A second way of attaining the object is, in the slope controller described above, to configure the difference stage in such a way that it can receive data values of the first and second component in alternation, and to equip the multiplication stage with a first register which is configured for alternatingly storing difference values derived from the first and from the second component.

Preferably this first register outputs a received difference value with a delay of one clock period or half of a clock period, corresponding to the time interval between two successive data values.

In addition, a second register, which is configured to output the difference value with a delay of three clock periods or three half clock periods, and a switch, which in alternation connects the output of the first register and the output of the second register to a multiplier, can be provided.

Such slope controllers can be used in particular as a component of a filter configuration according to the invention, the filter configuration being used as a frequency range equalizer.

Other features which are considered as characteristic for the invention are set forth in the appended claims.

Although the invention is illustrated and described herein as embodied in a filter configuration and slope detector for quadrature amplitude modulated signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 5:
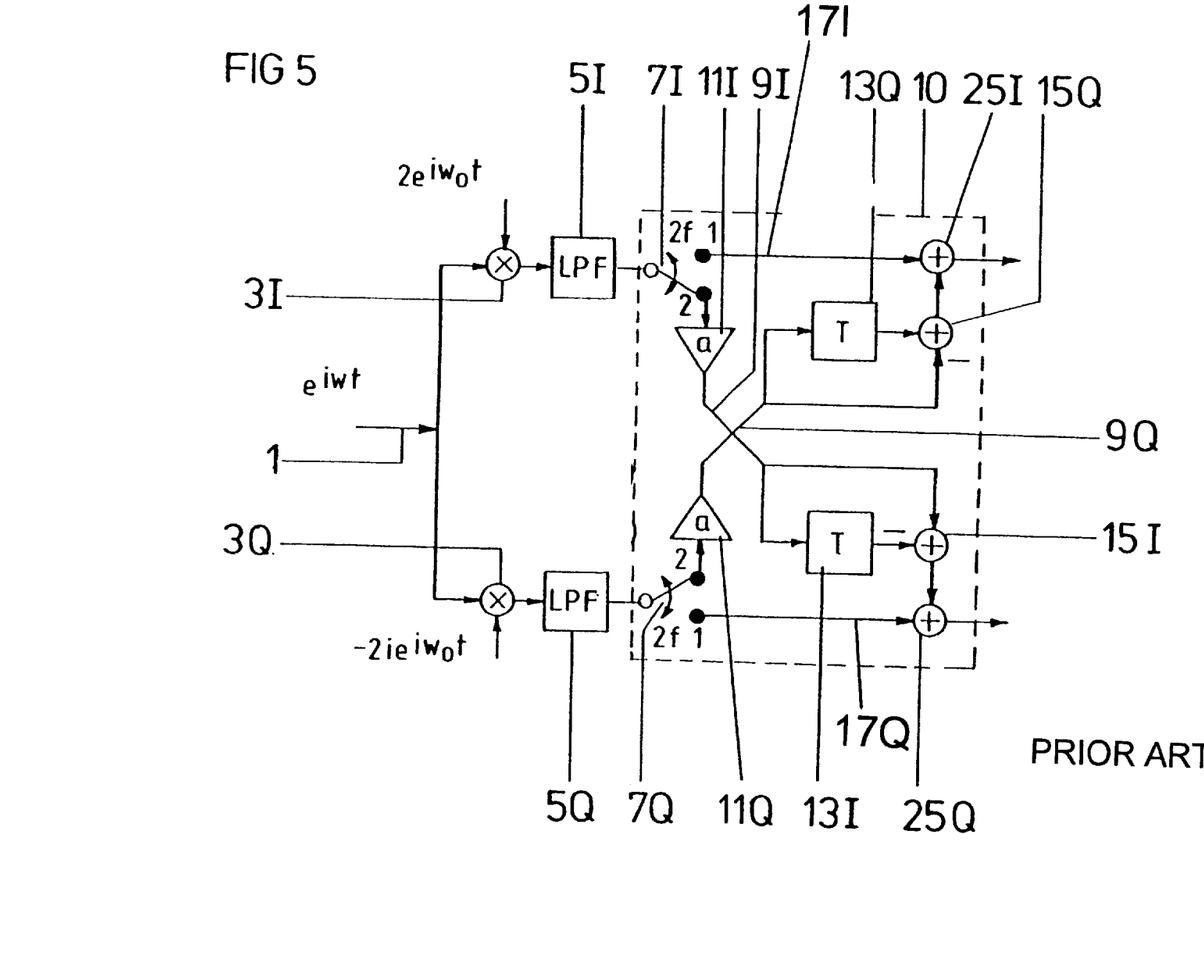
FIG. 5 is a circuit block diagram of a conventional frequency range equalizer.
Figure 6:
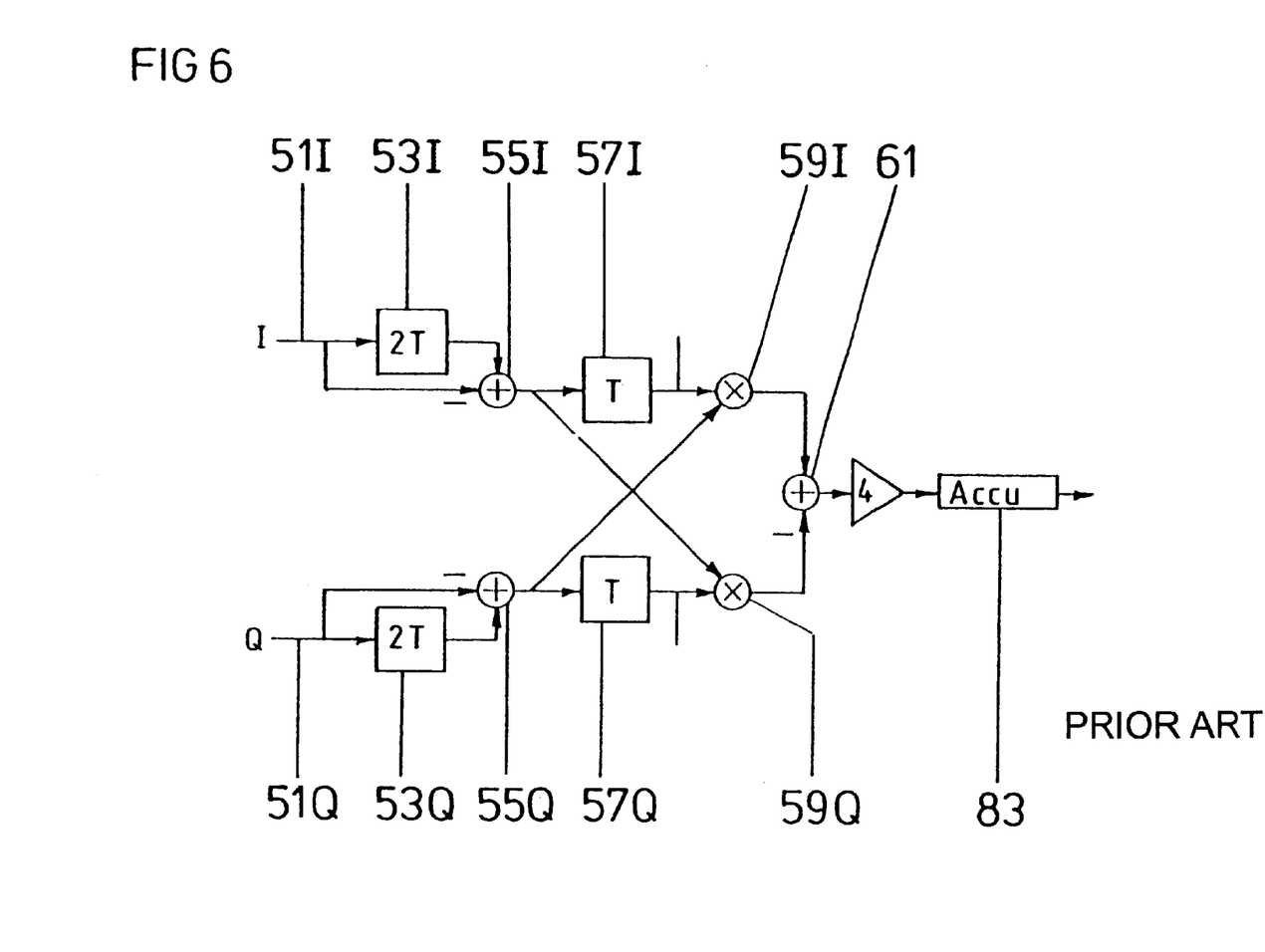
FIG. 6 is a circuit block diagram of a conventional slope detector.

Referring now to the figures of the drawings in detail and first, particularly, to FIGS. 5 and 6 thereof, there are shown a frequency range equalizer and a slope detector according to the prior art, which will be first described for the sake of easier comprehension of the invention.

The frequency range equalizer shown in FIG. 5 is known from the article cited above. Via an input 1, it receives a QAM signal, shown as a complex-valued oscillation $e^{i\omega t}$. The signal is split to an I channel (at the top in the drawing) and a (lower) Q channel. A multiplier 3I in the I channel multiplies the QAM signal with an oscillation $2e^{i\omega_0 t}$. By filtering in a low-pass filter 5I, the component having the difference frequency is separated from the product, and in this way one of the two signals modulated on the carrier is recovered, designated in the drawing as $e^{i\omega_B t}$, where $\omega_B$ stands for the difference between $\omega$ and $\omega_0$ in the base frequency range. The second signal, designated as $-ie^{i\omega_B t}$, is obtained in the Q channel analogously by multiplication by an oscillation $-2ie^{i\omega_0 t}$, which is phase-shifted by $\pi/2$, and by low-pass filtering. The signal components are understood to be real in a practical embodiment; the complex notation used here simply means that the I component can be understood as a real component and the Q component as a negative imaginary component, or, which would mean the same thing, that the Q component can be understood as a real component and the I component as an imaginary component of a complex-valued total signal. At the output of the multipliers, demodulated data sequences I=( . . . , I(0), I(T/2), I(T), I(3T/2), I(2T) , . . . ) and, respectively, Q=( . . . , Q(0), Q(T/2), Q(T), Q(3T/2), Q(2T) , . . . ) are available.

These two signal sequences or signal trains are input into a filter configuration 10, which for the sake of frequency range equalization is intended to realize a transfer function having the following form:

$$S(z)=ia+z^{-T/2}-iaz^{-T}.$$

Since the two data sequences I and Q vary relative to one another like the real and negative imaginary components, or like the imaginary and real components of a complex-valued sequence, this transfer function can be realized by adopting or taking over the signal components of the filtered signal, that correspond to imaginary terms of the transfer function, from the respectively other channel, taking the sign into account. This means that to generate a filtered data value on the I channel, a data value I([2n+1]/2) for the real term of the transfer function and values $-aQ(n)$ and $aQ(n+1)$ for the two imaginary terms have to be added together, while conversely to generate a filtered data value on the Q channel, a respective data value Q([2n+1]/2) for the real term of the transfer function and values $aI(n)$ and $-aI(n+1)$ for the two imaginary terms must be added up.

At the output of the filter configuration 10, the filtered data are output with the period T. Thus only every other one of the input values needs a filtered value. Instead of discarding the unneeded values of the output, the data are distributed by switches 7I, 7Q already at the input of the filter configuration 10 in such a way that values not needed are not calculated either. With a frequency equal to twice the data output frequency of the filter configuration, the switches 7I and 7Q switch the data I([2n+1]T/2) and Q([2n+1]T/2) to the I and Q channels 17I, 17Q, respectively, of the filter configuration 10 and the data I(nT) and Q(nT) to the cross branches 9I and 9Q, respectively.

Each cross branch 9I, 9Q includes one multiplier 11I, 11Q, which receives the data sent onward by the switches 7I and 7Q, respectively, and multiplies them by a weighting factor a. The value of a is adjustable as a function of the outcome of detection by a slope detector, which will be addressed in further detail in conjunction with FIG. 6. The output of the multiplier 11I, 11Q is connected to a register 13I, 13Q and to a first input of an adder 15I, 15Q. The register 13I, 13Q outputs the received data value, delayed by one clock period T, to a second input of the adder. When adding, the adder 15I takes the delayed data value, arriving from the register, with the reverse sign into account; the adder 15Q takes the undelayed data value with the reversed sign into account. The transfer functions of the two cross branches are thus $$S^*_I(z)=a-az^{-T}$$

and $$S^*_Q(z)=-a+az^{-T}, \text{ respectively.}$$

A further adder 25I and 25Q is disposed in the channel 17I and 17Q, respectively, and at a first input it receives data values from the switches 7I, 7Q via a delay element (not shown). A delay element causes a delay of one-half of a clock period, so that if the value I(0) is present at the input of the I channel 17I of the filter configuration, for instance, the adder 25I receives the value I(-T/2). The transfer function of the I channel up to the input of the adder can accordingly be written as $$S^{**}_I(z)=z^{-T/2}.$$

At the same time, the cross branch 9Q outputs the value $aQ(0)-aQ(-T)$ to the second input of the adder 25I. Since as noted I and Q can be considered respectively as the real and the negative imaginary component of a complex train, the total transfer function up to the output of the adder becomes $$S_I(z)=S^{**}_I(z)-i\, S^*_Q(z)=ia+z^{-T/2}-iaz^{-T}.$$

Since conversely, I can also be understood as the (positive) imaginary component to Q, it can be appreciated that it is also true that $$S_Q(z)=S^{**}_Q(z)+i\, S^*_I(z)=ia+z^{-T/2}-iaz^{-T}.$$

The filter configuration 10 accordingly p erforms the desired transfer function S(z).

This frequency range equalizer has been proposed for radio relay applications with data transmission rates of up to 60 Mbaud.

Figure 1:
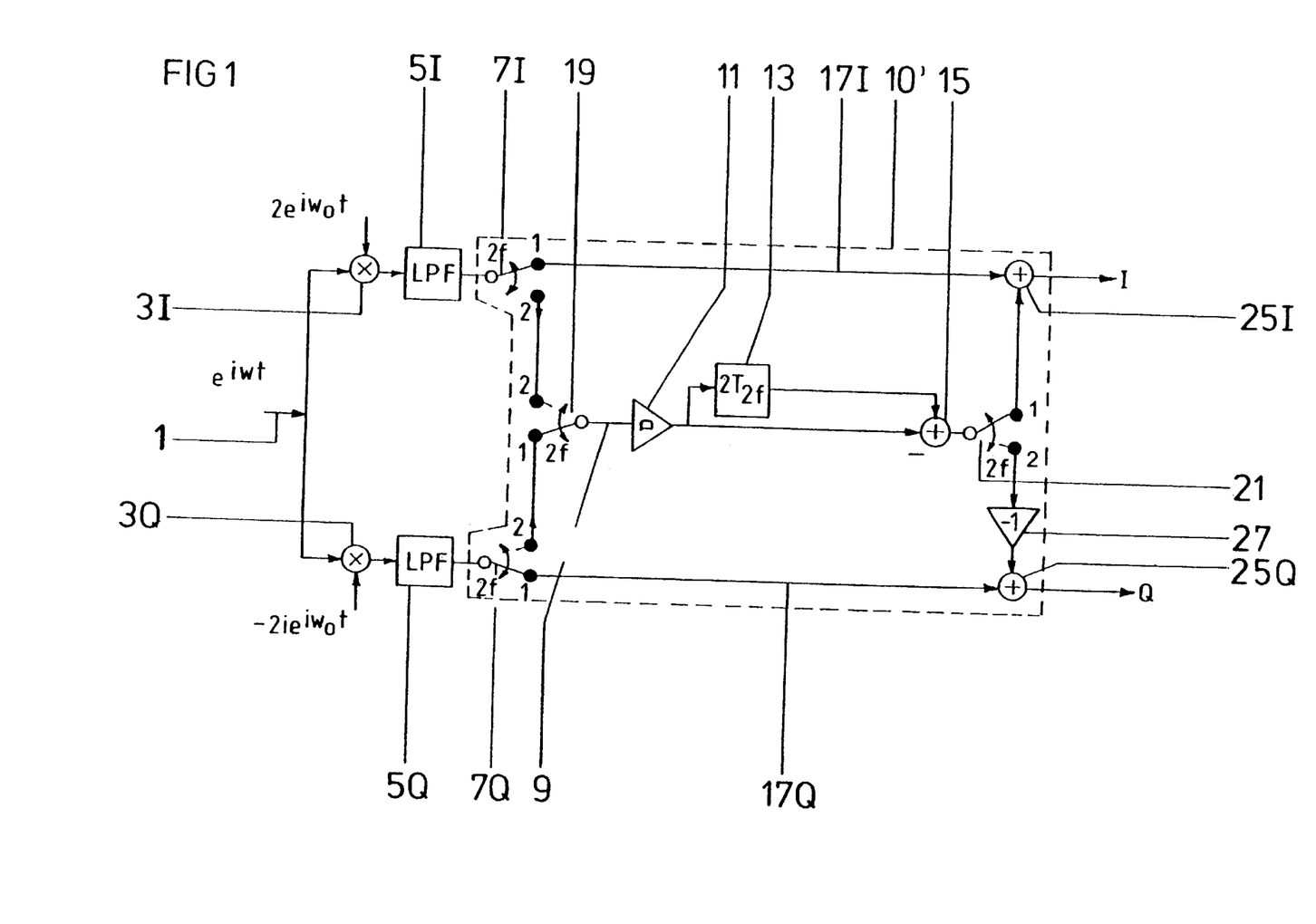
FIG. 1 is a circuit block diagram of a first embodiment of a filter configuration according to the invention.

At lower transmission rates, for instance of 7 Mbaud, in the transmission of video data by cable, it is possible to reduce the expense for circuitry by not providing double circuit elements operated in parallel but instead simply using them repeatedly over time. FIG. 1 shows a first example of an equalizer with a filter configuration 10 of the invention in which this is the case.

The input 1 of the equalizer receives a QAM signal with the symbol frequency f=1/T. The multipliers 3I, 3Q and low-pass filters 5I, 5Q are the same as in the equalizer of FIG. 5 and are therefore not described again here. Connected to the output of each low-pass filter 5I, 5Q is a switch 7I and 7Q, respectively, which sends the data . . . I(-1/2), I(0), I(1/2), I(1), . . . and . . . Q(-1/2), Q(0), Q(1/2), Q(1), . . . that arrive at twice the symbol frequency alternately on to an associated channel 17I, 17Q, each including a respective adder 25I and 25Q, or to a first element 19 of a switch configuration. This first switch 19 sends the data, which are directed to it, onward in alternation to a downstream cross branch 9 and thus generates a chronologically internested or interleaved data sequence Q(-1), I(-1), Q(0), I(0), Q(1), I(1), . . . .

The cross branch 9 includes a multiplier 11, which multiplies the data which are output by the first switch 19 by a weighting factor a. The multiplier operates at twice the symbol frequency f as its clock frequency.

A register 13 is connected to the output of the multiplier 11. It is constructed as a FIFO with a memory depth of two places, so that at any time it contains the two immediately previous data values, and when a new value arrives it outputs the older of the two stored values. For instance, if the multiplier outputs the value $aI(n)$, then in the register the values aQ(n) and aI(n−1) (where n= ... , −1, 0, 1, 2 ... ), are stored in memory, and the value aI(n−1) is output.

An adder 15 with two inputs is connected via one input to the multiplier 11 and via the other input to the output of the register 13. It forms the sum of the output data value of the register 13 and the negative data value of the multiplier 11, that is, aI(n−1)−aI(n).

At the output of the cross branch 9, a second switch 21 is provided, which is operated in a manner synchronized with the first switch in such a way that whenever the first switch 19 receives data from the Q channel, the second switch is connected to the I channel, and vice versa.

One output of the second switch 21 is connected directly to the adder 25I of the I channel 17I. A delay element (not shown) in the I channel guarantees that if a value aQ(n−1)−aQ(n) is output from the cross branch to the adder 15I, the value I(n−1/2) is present at its other input. The adder 25I then outputs the equalized data value I(n−1/2)+aQ(n−1)−aQ(n).

The second output of the second switch 21 is connected to the Q channel adder 25Q via a sign exchanger 27 so that on the Q channel 17Q, equalized data values Q(n−1/2)−aI(n−1)+aI(n)

are respectively output.

The outcome of the processing in the equalizer of FIG. 1 is thus the same as in the equalizer of FIG. 5, except that in the equalizer of FIG. 1 this outcome is attained with only a single cross branch 9.

To ascertain the weighting factor a, the difference in the power densities in the upper and lower side band of the QAM signal transmitted must be ascertained. FIG. 6 shows a slope detector with which this difference in the signal transformed into the base band is possible. In the base band, the upper and lower side band correspond to the positive and negative "direction of rotation" of the QAM signal. These can be discriminated or separated from one another using filters having the transfer functions $$F_{ub} = 1 + iz^{-1} - z^{-2} - iz^{-3}$$

and $$F_{lb} = -1 + i z^{-1} + z^{-2} - iz^{-3}$$

with the subscripts ub standing for the upper side band (upper band) and lb for the lower side band (lower band).

The difference in the power densities is defined by $$I_u^2 - I_l^2 + Q_u^2 - Q_l^2.$$

To determine $I_u^2 - I_l^2$, data filtered with the above transfer functions $$I_u = I(0) + iI(-1) - I(-2) - iI(-3) = I(0) + -Q(-1) - I(-2) + Q(-3)$$

and $$I_l = -I(0) + iI(-1) + I(-2) - iI(-3) = -I(0) + (-Q(-1)) + I(-2) + Q(-3)$$

are squared and subtracted from one another. This can be done by way of the equation $$I_u^2 - I_l^2 = (I_u - I_l)(I_u + I_l) = 4[-Q(-1) + Q(-3)][I(0) - I(-2)].$$

The procedure for determining $Q_u^2 - Q_l^2$ is analogous. The sum $I_u^2 - I_l^2 + Q_u^2 - Q_l^2$ can be calculated with the slope detector shown in FIG. 6. The slope detector receives two components of a QAM signal at separate inputs 51I, 51Q of separate circuit branches. A difference stage, including a respective register 53I, 53Q, which delays by two clock periods, and a respective adder 55I, 55Q with an inverting input, forms the difference between a received data value and the data value received two clock periods earlier in the same component. The output signal of each adder 55I, 55Q is connected to a register 57I, 57Q, which delays by one clock period, and to one input of a multiplier 59Q, 59I of the respective other circuit branch. The second input of the multiplier 59I, 59Q is connected to the output of the register 57I, 57Q of the respective same circuit branch. As can easily be appreciated, at the same time the adders 55I, 55Q output the values −I(0)+I(−2) and Q(0)+Q(−2), respectively; the registers 57I, 57Q output the values −I(−1)+I(−3) and −Q(−1)+Q(−3); and the multipliers 59I, 59Q output the values [−I(−1)+I(−3)][−Q(0)+Q(−2)]0 and [−Q(−1)+Q(−3)][−I(0)+I(−2)]. An adder 61 with an inverting input forms the difference of the two products. A multiplier for calibration of the result by multiplication by the factor 4 and an accumulator 83 for averaging over time are connected to the output of the adder 61. This circuit can be connected parallel to the equalizer and can process the same input signals as it does, or it can also be disposed downstream of the equalizer. In the latter case, a simple feedback control can be provided, which receives the output signal of the slope detector and regulates the factor a in such a way that its output signal becomes minimal. Since in that case only relative values of the output signal are needed, the calibrator-multiplier can be dispensed with.

Figure 2:
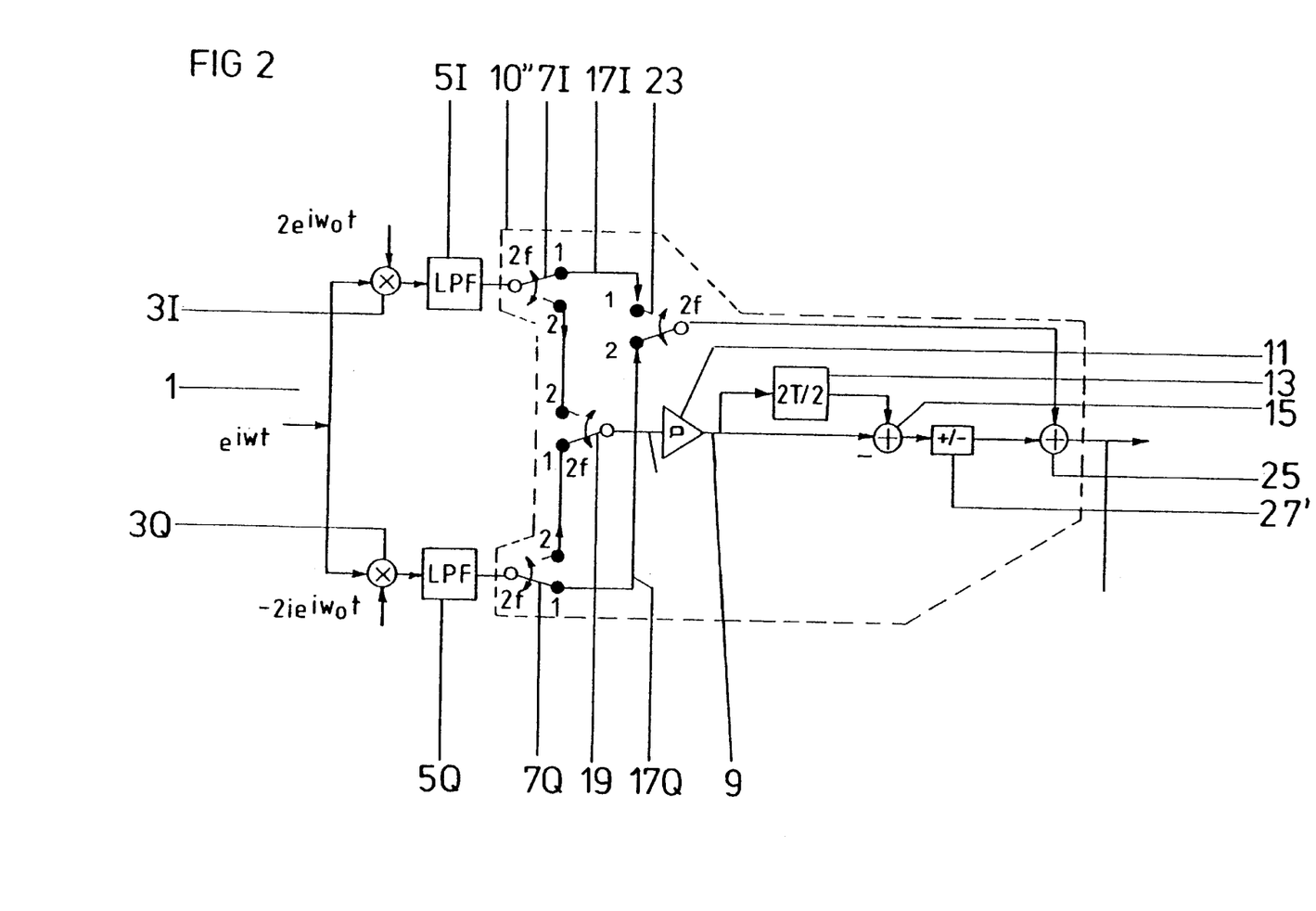
FIG. 2 is a circuit block diagram of a second embodiment of a filter configuration according to the invention.

FIG. 2 shows a second embodiment of a frequency range equalizer with a filter configuration 10" according to the invention. The multipliers 3I, 3Q, low-pass filters 5I, 5Q and switches 7I, 7Q are the same as in the equalizers of FIGS. 5 and 1. The first switch 19 of the filter configuration as well as the multiplier 11, register 13 and adder 15 of the cross branch 9 are also the same as in the filter configuration 10' of FIG. 1. These elements will therefore not be described again here. The switch 21 of FIG. 1 is replaced with a switch 23, which in alternation receives data from the channels 17I, 17Q and sends them on as a chronologically internested train or interleaved sequence to an adder 25.

The cross branch includes an additional element in the form of a sign exchanger 27', which in alternation receives data values from the adder 15 that take the form aQ(n)−aQ(n−1) or aI(n)−aI(n−1) and sends the I values on with an unchanged sign but sends the Q values on to the adder 25 with a changed sign.

The switches 19 and 23 are synchronized with one another such that when the cross branch 9 outputs a value having the form aQ(n)−aQ(n−1), a suitably delayed value I(n−1/2) from the switch 19 is present at the second input of the adder 25, or that a value aI(n)−aI(n−1) at the adder 25 meets a value Q(n−1/2). The adder 25 thus generates a train or sequence of data I(−1/2)+aQ(−1)−aQ(0)
Q(−1/2)−aI(−1)+aI(0)
I(1/2)+aQ(0)−aQ(1)
Q(1/2)−aI(0)+aI(1)
I(3/2)+aQ(1)−aQ(2)
Q(3/2)−aI(1)+aI(2) ... , which each originate in alternation from filtered elements of the sequences I and Q.

This sequence can be demultiplexed and applied to the inputs of the slope detector of FIG. 6, in order to determine the weighting factor a for the equalization.

Figures 3, 4:
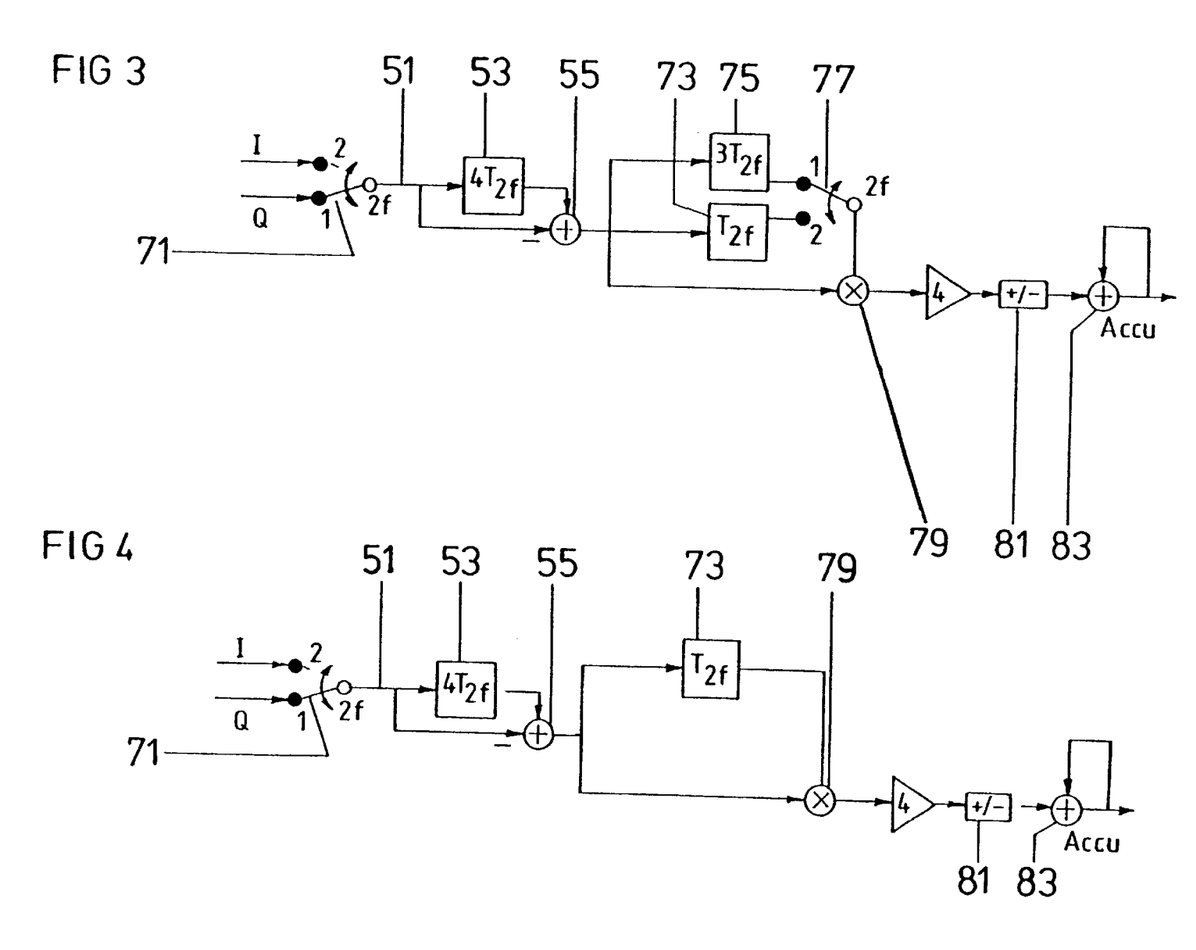
FIG. 3 is a circuit block diagram of a first embodiment of a slope detector according to the invention.
FIG. 4 is a circuit block diagram of a second embodiment of a slope detector according to the invention.

An advantageous embodiment of a slope detector that is especially suitable for use with the equalizers of FIGS. 1 and 2 is shown in FIG. 3.

The slope detector is preceded by a multiplexer 71, which receives I and Q signal components or data sequences from the outputs of the equalizer of FIG. 1 and combines them into a sequence, alternatingly including I and Q elements, as follows: . . . , I(−1), Q(−1), I(0), Q(0), I(1), Q(1), . . . , If the slope detector is used with the equalizer of FIG. 2, this multiplexer can be omitted, since the output train of this equalizer already includes alternating I and Q values.

In contrast to the slope detector of FIG. 6, this slope detector has only one input 51 and one difference stage, with one register 53, which delays by two clock periods, and one adder 55 with an inverting input, which forms the difference between a received data value and the data value received to clock periods earlier of the same component. Since in this slope detector, two data values, that is, one I value and one Q value, are input in each clock period, the register 53 has a memory capacity of four places.

The difference stage generates a sequence having the form

−I(−1)+I(−3), −Q(−1)+Q(−3), −I(0)+I(−2), −Q(0)+Q(−2), −I(1)+I(−1), −Q(1)+Q(−1), −I(2)+I(0), −Q(2)+Q(0), . . . .

Two registers 73, 75 are connected parallel to one another to the output of the adder 55; they delay arriving values by one half clock period and three half clock periods, respectively. A switch 77 connects the output of a respective one of the registers 73, 75 to the input of a multiplier 79 and is switched over between the two registers with a one-half clock period. The other input of the multiplier is connected directly to the adder 55.

If the data value I(0) is present at the input 51, then the multiplier is supplied directly from the adder 55 with the value −I(0)+I(−2) and from the register 73 the value −Q(−1)+Q(−3). A half clock period later, the values −Q(0)+Q(−2) and −I(−1)+I(−3)—the latter delayed by one and a half clock periods, by the register 75—are present at the multiplier. Thus for the clock period 0, two products are generated, each representing one measure for $I_u^2-I_l^2$ and $Q_l^2-Q_u^2$ and each based on data of clock periods −3 to 0.

The multiplier 79 sends the two products onward to a sign exchanger 81, which reverses the sign of every other value that arrives. An accumulator 83 adds up the values arriving from the sign exchanger to form a sliding average value.

As can easily be seen with reference to the description of FIG. 6, the sum of two respective successive output values of the sign exchanger 81 indicates the difference in power densities $I_u^2-I_l^2+Q_u^2-Q_l^2$ The circuit of FIG. 3 thus furnishes the same result as that of FIG. 6, but does so with only one difference stage and without the adder 61, whose function is taken over by the accumulator 83.

FIG. 4 shows a further simplified embodiment of the slope detector of FIG. 3. In this slope detector, the register 75 and switch 77 are dispensed with, so that the multiplier 79 always receives delayed values from the register 73. It thus forms a sequence of products taking the form

[−Q(−1)+Q(−3)][−I(0)+I(−2)],
[−Q(0)+Q(−2)][−I(1)+I(−1)],
[−Q(1)+Q(−1)][−I(2)+I(0)],
[−Q(2)+Q(0)][−I(3)+I(1)], . . . .

The first and third terms above are each a measure for $I_u^2-I_l^2$, while the second and fourth terms are a measure for $Q_l^2-Q_u^2$. This sequence differs from that of the multiplier 79 in the circuit of FIG. 3 in that successive products are not derived in pairs from data of the same clock periods. Instead, the first $I_u^2-I_l^2$ term, derived from data of clock periods −3 to 0, is followed by a $Q_l^2-Q_u^2$ term that is calculated from data of clock periods −2 to 1. However, since changes in the power distribution occur slowly in comparison to the operating frequency of the slope detector, and the output signal of the slope detector used to regulate the factor a is averaged over a plurality of clock periods, this change has no effect on the output signal.

We claim:

1. A filter configuration for a demodulated QAM signal, comprising:

a first channel for a cosine demodulated QAM signal component;

a second channel for a sine demodulated QAM signal component;

a filter circuit for receiving the signal components, said filter circuit having transfer functions for the signal components, said transfer functions including terms in phase with the signal component of a respective one of said first an second channels and including terms phase-shifted by at least one of π/2 and −π/2 with respect to the signal component of said respective one of said first an second channels;

said filter circuit including a cross branch having an output and an input for picking up signal portions from a respective other one of said first and second channels, the signal portions corresponding to the terms of the transfer functions phase-shifted by at least one of π/2 and −π/2; and a switch configuration having a first state and a second state, said switch configuration, when being in said first state, connecting said input of said cross branch to said first channel and said output of said cross branch to said second channel, said switch configuration, when being in said second state, connecting said input of said cross branch to said second channel and said output of said cross branch to said first channel.

2. The filter configuration according to claim 1, wherein each respective one of said first and second channels includes a switch for passing incoming data alternately to said respective one of said first and second channels and to said cross branch.

3. The filter configuration according to claim 1, wherein said cross branch includes a multiplier for multiplying at least one of said terms phase-shifted by at least one of π/2 and −π/2 by a weighting factor.

4. The filter configuration according to claim 1, wherein said cross branch includes at least one delay register.

5. The filter configuration according to claim 1, wherein said phase-shifted terms of one of said transfer functions are of equal magnitude and opposite to said phase-shifted terms of another one of said transfer functions.

6. The filter configuration according to claim 1, including a first adder assigned to said first channel and a second adder assigned to said second channel, said first adder connecting said output of said cross branch to said first channel, said second adder connecting said output of said cross branch to said second channel.

7. The filter configuration according to claim 6, wherein said first and second adders add signal portions transmitted via said cross branch with respectively different signs to respective ones of the signal components transmitted respectively via said first and second channels.

8. The filter configuration according to claim 1, wherein said filter configuration includes a switch and an adder having a first input alternately connected, via said switch, to said first and second channels, and having a second input connected to said output of said cross branch.

9. The filter configuration according to claim 8, wherein said cross branch includes a sign exchanger for alternately changing a sign of a signal portion and not changing the sign of the signal portion, as a function of said first and second states of said switch configuration.

10. The filter configuration according to claim 3, including a slope detector for detecting a difference in power densities in an upper side band and a lower side band of a QAM signal and for controlling the weighting factor such that the difference is minimized.

11. The filter configuration according to claim 10, wherein said first and second channels, said filter circuit and said switch configuration form a frequency range equalizer, and including a slope detector, having:

a difference stage alternately receiving data values of a first one of the signal components and data values of a second one of the signal components for forming a respective difference between a data value and a most recently received previous data value of a respective one of the first and second one of the signal components;

a multiplication stage for forming a product of a difference value, derived from one of the first and second one of the signal components, and a further difference value derived from another one of the first and second one of the signal components; and said multiplication stage including a register for storing one of the difference value and the further difference value derived alternately from the first and second one of the signal components.

12. The filter configuration according to claim 11, wherein said register is configured to output one of the difference value and the further difference value with a delay of half of a clock period.

13. The filter configuration according to claim 12, wherein said register is a first register having a first output, said multiplication stage includes a second register having a second output and configured to output one of the difference value and the further difference value with a delay of one and a half clock periods, said multiplication stage further including a switch and a multiplier, said switch connects said first output of said first register and said second output of said second register to said multiplier.

14. A slope detector, comprising:

a difference stage alternately receiving data values of a first component of a QAM signal and data values of a second component of the QAM signal for forming a respective difference between a data value and a most recently received previous data value of a respective one of the first and second components of the QAM signal;

a multiplication stage for forming a product of a difference value, derived from one of the first and second components of the QAM signal, and a further difference value derived from another one of the first and second components of the QAM signal; and said multiplication stage including a register for storing one of the difference value and the further difference value derived alternately from the first and second components of the QAM signal.

15. The slope detector according to claim 14, wherein said register is configured to output one of the difference value and the further difference value with a delay of half of a clock period.

16. The slope detector according to claim 15, wherein said register is a first register having a first output, said multiplication stage includes a second register having a second output and configured to output one of the difference value and the further difference value with a delay of one and a half clock periods, said multiplication stage further including a switch and a multiplier, said switch connects said first output of said first register and said second output of said second register to said multiplier.

* * * * *